US007305636B2

(12) United States Patent
Baumgartner et al.

(10) Patent No.: US 7,305,636 B2
(45) Date of Patent: Dec. 4, 2007

(54) METHOD AND SYSTEM FOR FORMAL UNIDIRECTIONAL BUS VERIFICATION USING SYNTHESIZING CONSTRAINED DRIVERS

(75) Inventors: Jason Raymond Baumgartner, Austin, TX (US); Tilman Gloekler, Gaertringen (DE); Joachim Kneisel, Stuttgart (DE); Johannes Koesters, Weil Im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 11/065,601

(22) Filed: Feb. 24, 2005

(65) Prior Publication Data

US 2006/0190874 A1 Aug. 24, 2006

(51) Int. Cl.
*G06F 17/50* (2006.01)

(52) U.S. Cl. .................................. 716/4; 716/5; 716/18
(58) Field of Classification Search .................... 716/1, 716/4, 5, 18; 703/14
See application file for complete search history.

(56) References Cited

U.S. PATENT DOCUMENTS

2005/0125754 A1* 6/2005 Schubert et al. ............... 715/5

* cited by examiner

*Primary Examiner*—Thuan Do
(74) *Attorney, Agent, or Firm*—Casimer K. Salya; Dillon & Yudell LLP

(57) ABSTRACT

A method, system and computer program product for performing verification is disclosed. A high-level description of a design is created and constrained drivers are synthesized from the high-level description of the design. A testbench is generated from the high-level description of the design and the constrained drivers and a formal equivalence is evaluated on the testbench to perform verification.

24 Claims, 3 Drawing Sheets

METHOD AND SYSTEM FOR FORMAL UNIDIRECTIONAL BUS VERIFICATION USING SYNTHESIZING CONSTRAINED DRIVERS

BACKGROUND OF THE INVENTION

1. Technical Field

The present invention relates in general to testing and verification, and in particular to verification of digital designs. Still more particularly, the present invention relates to a system, method and computer program product for verification of digital designs unidirectional bus verification.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process. In order to maximize the verification coverage attainable with the resources available to a hardware design team, numerous verification methods have been developed, each with their own strengths and weaknesses.

Among available methods, the use of on-chip trace and debug buses has become popular. On-chip trace and debug buses are used to monitor internal nodes that cannot be readily routed to chip pads due to package limitations. These buses represent a unidirectional tree structure and can be configured to route individual inputs to external pads or internal debug entities (like trace logic analyzer or performance monitor logic) by configuring multiplexors and on-bus ramps appropriately. These buses also contain non-configurable elements such as interfaces between different clock domains (e.g., speed converters).

Due to the high complexity of recent chips, these buses have reached a significant complexity in terms of the number of primary inputs and the number of configuration modes. Verification of these buses is difficult because only a very limited number of bus configuration scenarios can be simulated and checked for correct connectivity in a reasonable amount of time with the methods available in the prior art. Any errors in such bus logic that slip into silicon are not only expensive to rectify; they also greatly jeopardize the ability to utilize the fabricated design for any purpose in the bring-up lab, to a degree even greater than for other functional errors.

What is needed is an automated method and system for formal verification of unidirectional on-chip trace and debug buses to reduce manual effort in verification process.

SUMMARY OF THE INVENTION

A method, system and computer program product for performing verification is disclosed. A high-level description of a design is received and constrained drivers are synthesized from the high-level description of the design. A testbench is generated from the high-level description of the design and the constrained drivers and a formal eqivalence is evaluated on the testbench to perform verification.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a methodology for unidirectional bus verification that is embodied by automatic testbench generation from high-level descriptions. Given a concise high-level description of a bus implementation under verification, the present invention automatically creates a testbench comprising a "configuration" for the implementation, and a set of "correctness properties" for the implementation, against which the present invention verifies the implementation. The data structures used for the high-level description include a "trace configuration" data structure for specification of the configuration, and a "trace definition" data structure that includes a structural description of the trace bus architecture together with correctness properties.

The "trace definition" description often "models" the implementation itself, and enables verification process to center on an equivalence-check of the implementation versus the trace definition description under the constraints of the trace configuration, though additional properties may be specified and checked using the present invention. The present invention includes a specification language that is designed to allow creation of specifications that are intuitive and concise enough for use as design documentation, which obviates the need to manually create a "spoken-language" design documentation apart from the verification process.

Such "spoken-language" design documentation tends to be error-prone due to incompleteness, ambiguities, and lack of ability to cross-verify that the design and its documentation stay consistent. The automatically created testbenches of the present invention are not only usable in simulation frameworks, but also in emulation and formal frameworks. The latter is a useful benefit that improves the ability of formal verification to expose many design flaws.

Figure 1:
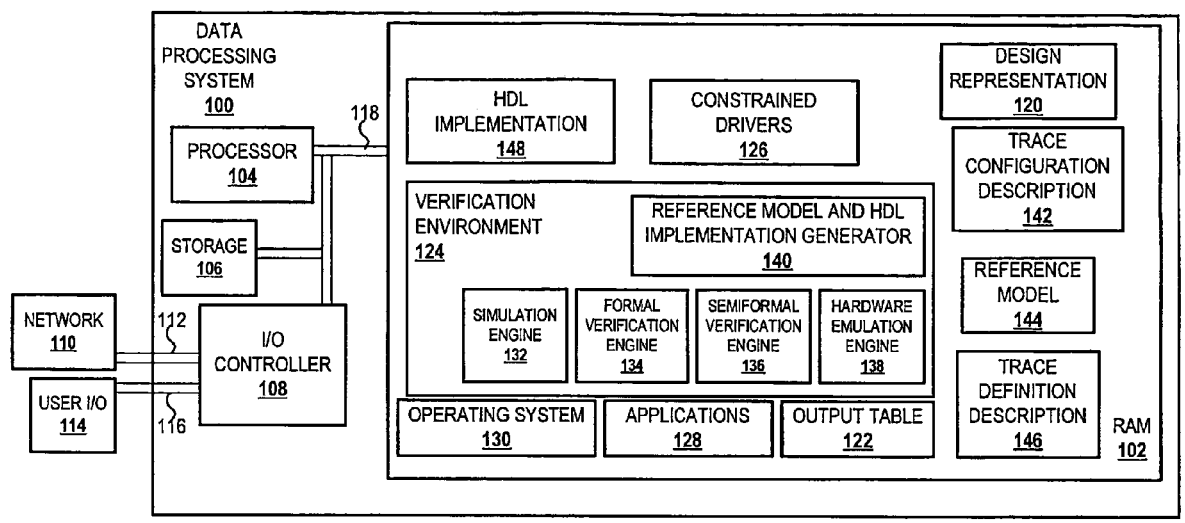
FIG. 1 depicts a block diagram of a data processing system equipped with a computer program product for verification of unidirectional system buses in digital designs in accordance with a preferred embodiment of the present invention.

With reference now to the figures, and in particular with reference to FIG. 1, a block diagram of a data processing system equipped with a computer program product for verification of digital designs in accordance with a preferred embodiment of the present invention is depicted. A data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions, while operating in accordance with a preferred embodiment of the present invention. These items include a design representation 120 and an output table 122, which is a result recording file, for interaction with a verification environment 124. A set of constrained drivers 126 is also stored in RAM 102.

Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes verification environment 124. Verification environment 124 performs one or more of four forms of verification on design representation 120 through the use of simulation engine 132, formal verification engine 134, semi-formal verification engine 136 and hardware emulation engine 138. Verification environment 124 also contains a reference model and HDL implementation generator 140. Reference model and HDL implementation generator 140 generates reference model 144 and HDL implementation 148.

Formal verification engine 134, semi-formal verification engine 136 and hardware emulation engine 138 use design representation 120, which contains a netlist representation suitable for formal verification, semi-formal verification, simulation, and hardware emulation environments. Verification environment 124 also interacts with a trace configuration description 142, a reference model 144, and a trace definition description 146.

Verification environment 124 records results to output table 122. Verification environment 124 may also report the contents of output table 122 or selected indicators of the status of design representation 120 to user I/O 114 or applications 128. Additionally, all or part of the data structures discussed above may, at times, be stored in storage 106.

Figure 2:
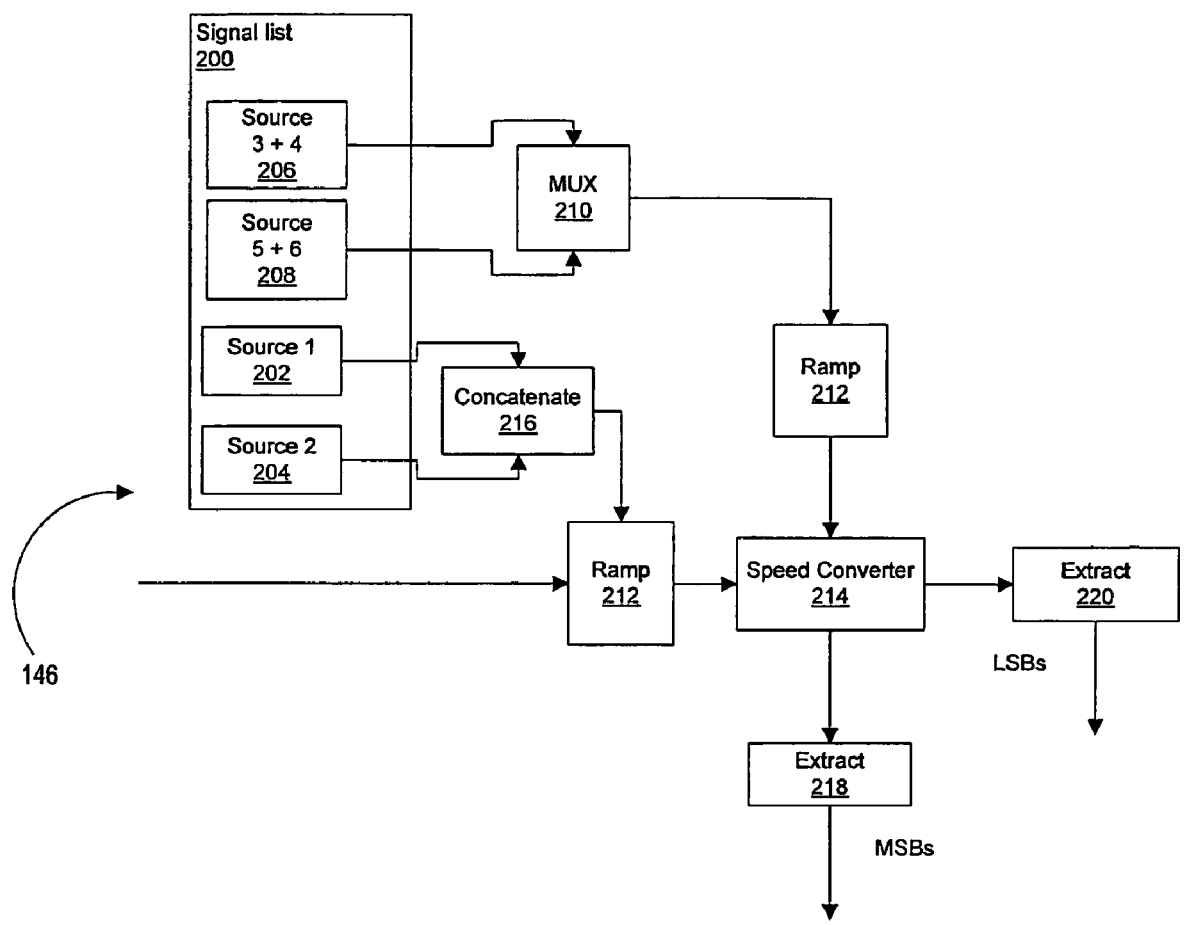
FIG. 2 illustrates a symbolic representation of the content of an exemplary trace definition file in accordance with a preferred embodiment of the present invention.

Turning now to FIG. 2, a symbolic representation of the content of an exemplary trace definition file in accordance with a preferred embodiment of the present invention is illustrated. Trace definition description 146 provides an abstract structural description of the bus, which can be regarded as an equivalent high level description to reference model 144, including all multiplexors, ramps and speed converters. Each block of trace definition description 146 supports a configurable number of delay elements.

A preferred embodiment supports several building blocks in trace definition description 146. A signal list 200 defines a group of primary input signals that enter the bus. In the preferred embodiment shown in FIG. 2, signal list 200 includes source 1 202, source 2 204, source 3+4 206 and source 5+6 208. A multiplexor 210 with configurable I/O width allows configurable encoding of selection conditions (e.g., one-hot, binary, or user-defined). A ramp 212 provides on-bus AND-OR combination to logically combine an additional input onto the main bus artery. In case of more than one enable bit, the inputs are sliced into groups that are individually enabled.

A speed converter 214 is configurable to provide the several interface mechanism types needed to interface between different asynchronous clock domains. Speed converter 214 can be used as a data interface between different clock domains and data widths. In design representation 120, the ratio between the two clock frequencies does not need to be an integer ratio. For verification purposes, a non-integer ratio such as 1:3.5134 is preferably mapped to a ratio of 1:4 for simplification. However, in such a case, a data valid bit has to be generated to avoid repetition of already sampled data values.

A concatenate function 216 concatenates several inputs together to form a wider bus (e.g., two 8-bit buses can be grouped to form a 16-bit bus). One or more extract functions 218 and 220 extract a selected subset of bits from the output of a preceding block (e.g., only bits 10 to 13 of a 16 bit bus). This function can also be provided in trace definition description 146 by referencing only a subset of the output bits of a block that is providing data.

Each block in a trace definition description 146, with the exception of the signal list 200 block, references the output of other blocks. The very first blocks, which form the leaves in the tree of tracedef blocks, are signal lists 200, enabling a concise structural description of complicated bus structures to be obtained with very few logic elements, which implicitly ensure that there is a path from each input signal (leaf of the tree) to the output of the bus (root of the tree).

An advantage of the high-level description in trace definition description 146 lies in that trace definition description 146 omits implementation details (e.g., NAND/NOR logic instances), providing a description that is more concise and less error-prone than the real design. In addition to the trace definition description 146, the present invention supports a trace configuration description 142 that specifies the constraints for proper operation of the bus (e.g., clocks and/or hold and enable conditions for the top level ports).

With trace definition description 146 and trace configuration description 142, the present invention automatically creates a bit-accurate and cycle-accurate reference model of the bus in a hardware description language (e.g., VHDL). Furthermore, random drivers for the primary inputs and drivers for the configuration bits are generated to stimulate the implementation and the reference model. Drivers are created both to stimulate (control valuations driven to) the primary inputs, as well as any internal configuration logic. These drivers are applied to both the implementation, and the reference model, to enable an "equivalence check" between the two. Without applying the same stimulus to both implementation and reference model, the equivalence check would fail As less than all configurations of the bus are typically legal, the drivers for configuration bits are constrained to the set of legal random values through the use of constrained drivers 126. Simulation at this stage by simulation engine 132 would replace the random inputs by arbitrarily selected deterministic values, which would make it impossible to simulate all combinations of more than about 40 random bits in a reasonable amount of time.

In contrast to simulation, formal verification engine 134 assigns symbolic variables to these inputs, which may be subject to constraints (e.g., not all combinations of a MUX selector are legal, though all possible one-hot encodings of the set of MUX selectors are legal) that extend the applicability of the methodology to significantly more input bits. As an example, the present invention uses formal verification engine 134 to exhaustively verify designs with more than 10,000 random inputs. Simulation of such a design by simulation engine 132 would require significantly more than 2^10,000 (where ^ denotes exponentiation) explicit test vectors, which is currently infeasible even given a very large number of simulation machines running by simulation engine 132 in parallel for a very large number of years.

The present invention enables a higher coverage while decreasing the overall verification time. Finally, trace definition description 146 has the ability to instantiate user-defined comparators for selected signals in the design (e.g., multiplexer outputs) to compare the generated reference model (composed of trace definition description 146 and trace configuration description 142) to the design in reference model 144. Comparison is performed using a formal equivalence check of both descriptions using checkers within formal verification engine 134 as correctness properties.

The following text example provides the content of an exemplary trace definition description 146 corresponding to the symbolic representation provided in FIG. 2.

```
concatenate_12= {
    type            = signal_list;
    frequency       = 1; # clock domain e.g. 1GHz
    input (0:7)     = signal_#1 (0:7); # implicit concatenate
                      by signal_list
    input (8:15)    = signal_#2 (0:7);
}
left_ramp = {
    type            = ramp;
    input_AND       = concatenate_12;
    input_AND_gate  = my hierarchy.my_ctrl_sig(42); # to be
ANDed with "input_AND"
    input_OR        = main_bus_from_left;
}
sconv_t_to_2 = {
    delay_B         = 1;# add one delay in new clock domain for
                      phase adjust
    type            = speed converter_1_2; # converts to double
frequency area and half bit width
    input           = left_ramp;
}
source_34 = {
    type            = signal_list;
    frequency       = 2;
    input (0:3)     = my_input_signal_#3 (20:23);
    input (4:7)     = my_other_input_signal_#4 (7:10);
}
source_56 = {
    type            = signal_list:
```

-continued

```
    frequency       = 2;
    input (0:0)     = my_input_signal_#5;
    input (1:7)     = my_other_input_signal_#6(7:13);
}
mux_34_56 = {
    type            = mux;
    selector        = my_select_signal (2:3);
    input_1         = 0b01; source_34;
    input_2         = 0b10, source_56;
}
right_ramp = {
    type            = ramp;
    delay           = 2; # add 2 delay cycles in current clock
                      domain (2GHz)
    input_AND       = mux_34_56;
    input_AND_gate  = right_ramp_control_signal (1:2); # each bit
gates off four bits at a time
    input_OR        = sconv_1_to_2;
    output          = the_signal_that_needs_to_be_checked
(0:7); # checker instantiation
}
MSBs = {
    type            = extract;
    input           = right_ramp (0:3); #MSBs in IBM notation
}
LSBs = {
    type            = extract;
    input           = right_ramp (4:7);
}
```

The following example provides an exemplary trace configuration description 142 applicable to the block provided in FIG. 1.

```
    tracedef_file      = example_bus.tracedef;  # Tracedef file to load
    top_level_blocks   = MSBs, LSBs;            # Top Level Blocks
(roots of tree)
    options            = gen_sim_drivers;       # option to generate
simulation drivers
    delay_for_checkers = 20;                    # delay for fail activation to
flush pipeline stages
    delay_for_reference_thold_2_3 = 2;          # phase in sim cycles btw.
                                                  clock signals
    dut_entity_name = my_device;                # device under test
    checker_entity_name = my_checker;           # checker
    # clock input definitions
    hold_2_signals=(# slower frequency)
    my_slow_clk,
    my_2nd_slow_clk
    ) ;
    hold_3_signals = (# faster frequency)
    my_fast_clk
    ) ;
    # constraints for top level ports
    Force_to_0_nets=(
    my_testmode_enable
    my_scan_enable
    ) ;
    force_to_1_nets=(
    my_bus_enable
    ) ;
    ramp_signals=(
    my_reset_signal, 15, 0: # creates a reset signal (15 cycles on '1',
    afterwards '0')
    ) ;
```

Figure 3:
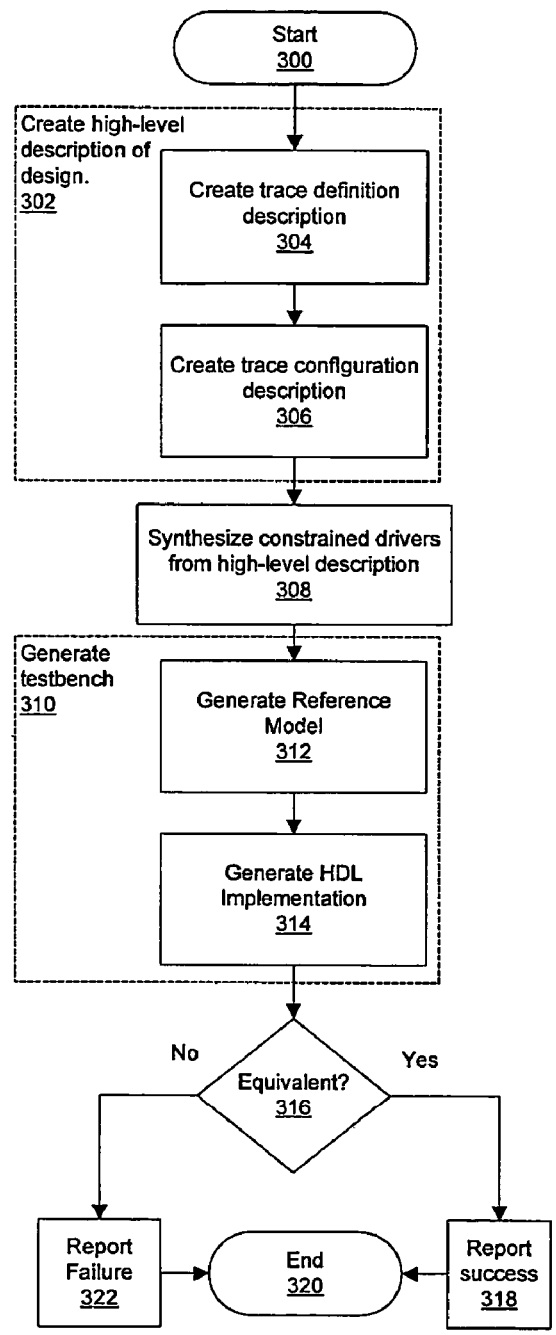
FIG. 3 is a high-level logical flowchart of a process for verification of unidirectional system buses in digital designs in accordance with a preferred embodiment of the present invention.

Referring now to FIG. 3, a high-level logical flowchart of a process for verification of unidirectional system buses in digital designs in accordance with a preferred embodiment of the present invention is depicted. In the embodiment reflected in FIG. 3, steps 300-320 are depicted (for the sake of exemplary clarity) serially as a single, linear process. One skilled in the art, however, will quickly realize that some of steps 300-320 may be performed in parallel or in sequences different from that depicted in FIG. 3, as portions of separate processes, or as portions of processes not depicted in the preferred embodiment, on separate data processing systems.

The process starts at step 300 and then moves to step 304, which depicts a user of a verification environment 124 utilizing verification environment 124 to create a trace definition description 146 of the design embodied by design representation 120. The process next proceeds to step 306. At step 306, a user of verification environment 124 utilizes verification environment 124 to create a trace configuration description 142 of the design embodied by design representation 120. Steps 304 and 306 are subsidiary elements of a larger step of creating a high level description of the design embodied by design representation 120.

The process then moves to step 308, which illustrates verification environment 124 synthesizing constrained drivers 126 from the high-level description created in step 302, containing trace definition description 146 and trace configuration description 142. The process proceeds to step 312. At step 312, verification environment 124 generates reference model 144. The process next proceeds to step 314, which depicts verification environment 124 generating HDL implementation 148. Steps 312 and 314 form a larger step 310, which depicts verification environment 124 generating a test bench.

The process then proceeds to step 316, which depicts verification environment 124 performing an equivalence check between reference model 144 and HDL implementation 148. In an alternative environment, an equivalence check can be replaced or augmented with one or more verifications of properties from the set of equal staging of selected groups of input bits that need to be aligned at a bus output, the staging depth of selected signals as to even and odd parity, the staging depth of selected signals as to a selected limit, and that selected groups of input bits are routed to different top level outputs and can be individually monitored. If the equivalence check between reference model 144 and HDL implementation 148 is positive, then the process moves to step 318, which illustrates verification environment 124 reporting success to output table 122. The process then ends at step 320. If the result of the equivalence check between reference model 144 and HDL implementation 148 at step 316 is negative, then the process moves to step 322. At step 322, verification environment 124 records a failure to output table 122. The process then ends at step 320.

After finishing the verification process described in FIG. 3 with trace definition description 142, trace definition description 142 has been proven to be equivalent to design representation 120. Therefore, trace definition description 142 can be used as a replacement for written documentation, and the user of the chip in the bring-up lab can easily use trace definition description 142 to discover appropriate bus configurations for monitoring relevant input signals. The availability of trace definition description 142 as written documentation is very useful, because it relies on only one formal description (trace definition description 142) and replaces error-prone documentation. Furthermore, the present invention is fully automated and can be integrated into a debugger GUI, such that specification could be performed graphically, and design errors found during the verification process could be reported via a graphical interface to facilitate the debugging process.

Furthermore, the present invention allows trace definition description 142 to be used for additional property checks. In a preferred embodiment, examples include ensuring equal staging of certain groups of input bits that need to be aligned at the bus output, ensuring that the staging depth of certain signals is even/odd or does not exceed a certain limit and ensuring that certain groups of input bits are routed to different top level outputs and can be individually monitored. For the user of the present invention, this property-checking functionality improves compliance with project design guidelines.

The present invention includes a method and system for formal verification. The method and system of the present invention are specifically embodied with respect to an example involving unidirectional on-chip trace and debug buses, but are applicable to other portions of a digital design. The method and system of the present invention reduce the required manual effort in the bus verification process, and efficiently attain a higher degree of coverage than is possible with prior-art simulation based approaches, resulting in cost and time savings in the hardware design and verification process.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for performing verification, said method comprising:
   receiving a high-level description of a design;
   synthesizing constrained drivers from a high-level description of said design;
   generating a testbench from said high-level description of said design and said constrained drivers; and
   evaluating a formal equivalence on said testbench to perform verification.

2. The method of claim 1, further comprising creating said high level description of said design by generating a trace definition description and a trace configuration file.

3. The method of claim 2, wherein the step of creating said trace definition description further comprises generating a trace definition description comprising one or more of the set of a signal list, a multiplexor, a ramp, speed converter, a concatenate function, and an extract function.

4. The method of claim 2, wherein the step of creating said trace configuration file further comprises modeling a set of constraints.

5. The method of claim 1, wherein said step of generating said testbench from said high-level description of said design and said constrained drivers further comprises generating a reference model and an HDL implementation from said high-level description of said design and said constrained drivers.

6. The method of claim 1, wherein said step of generating said testbench from said high-level description of said design and said constrained drivers further comprises generating a testbench usable by one or more of the set of simulation frameworks, emulation frameworks, and formal verification frameworks.

7. The method of claim 1, wherein said constrained drivers further comprise symbolic random values to represent legal test stimulus.

8. The method of claim 7, wherein said testbench comprises said design under test and a set of correctness properties, wherein said set of correctness properties is utilized for verification of said design under test.

9. A system for performing verification, said system comprising:
   means for creating a high-level description of a design;
   means for synthesizing constrained drivers from said high-level description of said design;
   means for generating a testbench from said high-level description of said design and said constrained drivers; and
   means for evaluating a formal equivalence on said testbench to perform verification.

10. The system of claim 9, wherein said means for creating said high level description of said design further comprises generating a trace definition description and a trace configuration file.

11. The system of claim 10, wherein the means for creating said trace definition description further comprises means for generating a trace definition description comprising one or more of the set of a signal list, a multiplexor, a ramp, speed converter, a concatenate function, and an extract function.

12. The system of claim 10, wherein the means for creating said trace configuration file further comprises means for modeling a set of constraints.

13. The system of claim 9, wherein said means for generating said testbench from said high-level description of said design and said constrained drivers further comprises means for generating a reference model and an HDL implementation from said high-level description of said design and said constrained drivers.

14. The system of claim 9, wherein said means for generating said testbench from said high-level description of said design and said constrained drivers further comprises means for generating a testbench usable by one or more of the set of simulation frameworks, emulation frameworks, and formal verification frameworks.

15. The system of claim 9, wherein said constrained drivers further comprise symbolic random values to represent legal test stimulus.

16. The system of claim 15, wherein said testbench comprises said design under test and a set of correctness properties, wherein said set of correctness properties is utilized for verification of said design under test.

17. A computer program product in a computer-readable medium for performing verification, said computer program product comprising:
   a computer-readable medium;
   instructions on the computer-readable medium for creating a high-level description of a design;
   instructions on the computer-readable medium for synthesizing constrained drivers from said high-level description of said design;
   instructions on the computer-readable medium for generating a testbench from said high-level description of said design and said constrained drivers; and
   instructions on the computer-readable medium for evaluating a formal equivalence on said testbench to perform verification.

18. The computer program product of claim 17, wherein said instructions for creating said high level description of said design further comprises instructions on the computer-readable medium for generating a trace definition description and a trace configuration file.

19. The computer program product of claim 18, wherein the instructions for creating said trace definition description further comprises instructions on the computer-readable medium for generating a trace definition description comprising one or more of the set of a signal list, a multiplexor, a ramp, speed converter, a concatenate function, and an extract function.

20. The computer program product of claim 18, wherein the instructions for creating said trace configuration file further comprises instructions on the computer-readable medium for modeling a set of constraints.

21. The computer program product of claim 17, wherein said instructions for generating said testbench from said high-level description of said design and said constrained drivers further comprises instructions on the computer-readable medium for generating a reference model and an HDL implementation from said high-level description of said design and said constrained drivers.

22. The computer program product of claim 17, wherein said instructions for generating said testbench from said high-level description of said design and said constrained drivers further comprises instructions on the computer-readable medium for generating a testbench usable by one or more of the set of simulation frameworks, emulation frameworks, and formal verification frameworks.

23. The computer program product of claim 17, wherein said constrained drivers further comprise symbolic random values to represent legal test stimulus.

24. The computer program product of claim 23, wherein said testbench comprises said design under test and a set of correctness properties, wherein said set of correctness properties is utilized for verification of said design under test.

* * * * *